United States Patent [19]

Ohkura

[11] Patent Number: 5,706,304
[45] Date of Patent: Jan. 6, 1998

[54] SEMICONDUCTOR LASER DEVICE

[75] Inventor: Yuji Ohkura, Tokyo, Japan

[73] Assignee: Mitsubishi Denki Kabushiki Kaisha, Tokyo, Japan

[21] Appl. No.: 603,237

[22] Filed: Feb. 20, 1996

[30] Foreign Application Priority Data

Aug. 18, 1995 [JP] Japan .................. 7-210457

[51] Int. Cl.$^6$ .................................. H01S 3/19
[52] U.S. Cl. .................................. 372/46; 372/45
[58] Field of Search .................................. 372/45, 46

[56] References Cited

U.S. PATENT DOCUMENTS

| | | | |
|---|---|---|---|
| 4,671,830 | 6/1987 | Burnham | 148/186 |
| 5,321,712 | 6/1994 | Itaya et al. | 372/43 |
| 5,566,198 | 10/1996 | Horie et al. | 372/46 |
| 5,583,880 | 12/1996 | Shakuda | 372/46 |

FOREIGN PATENT DOCUMENTS

| | | |
|---|---|---|
| 0612128 | 8/1994 | European Pat. Off. . |
| 2172287 | 7/1990 | Japan . |
| 376288 | 4/1991 | Japan . |
| 5304336 | 11/1993 | Japan . |
| 2099624 | 12/1982 | United Kingdom . |
| 2301481 | 12/1996 | United Kingdom . |
| 8800404 | 1/1988 | WIPO . |

*Primary Examiner*—James W. Davie
*Attorney, Agent, or Firm*—Leydig, Voit & Mayer, Ltd.

[57] ABSTRACT

A semiconductor laser device includes a first conductivity type GaAs substrate; a first conductivity type first lower cladding layer disposed on the GaAs substrate, lattice-matching with the GaAs substrate, and having an energy band gap; a first conductivity type AlGaAs second lower cladding layer disposed on the first lower cladding layer and having an energy band gap larger than the energy band gap of the first lower cladding layer; an active layer disposed on the second lower cladding layer and having an energy band gap smaller than the energy band gap of the first lower cladding layer; a second conductivity type AlGaAs second upper cladding layer disposed on the active layer and having an energy band gap; a second conductivity type first upper cladding layer disposed on the second upper cladding layer, lattice-matching with the GaAs substrate, and having an energy band gap larger than the energy band gap of the active layer and smaller than the energy band gap of the second upper cladding layer; a second conductivity type GaAs contact layer disposed on the first upper cladding layer; and first and second electrodes respectively disposed on the substrate and the contact layer. In this structure, the stress within the crystalline structure of the laser device is reduced and the crystalline defect density is reduced, whereby the reliability of the device is improved.

7 Claims, 8 Drawing Sheets

SEMICONDUCTOR LASER DEVICE

FIELD OF THE INVENTION

The present invention relates to a 0.78 µm band buried ridge type semiconductor laser device and a method for fabricating the semiconductor laser device.

BACKGROUND OF THE INVENTION

FIG. 7 is a cross-sectional view illustrating a 0.78 µm band buried ridge type semiconductor laser device according to a prior art. In the figure, reference numeral 1 designates an n type GaAs substrate having opposed front and rear surfaces. An n type GaAs buffer layer 2 having a thickness of 1 µm is disposed on the front surface of the substrate 1. An n type $Al_xGa_{1-x}As$ (Al composition x=0.48) lower cladding layer 3 having a thickness of 1.5 µm is disposed on the buffer layer 2. An active layer 4 is disposed on the lower cladding layer 3. The active layer 4 has a quantum well structure in which $Al_xGa_{1-x}As$ (x=0.1) well layers and $Al_xGa_{1-x}As$ (x=0.35) barrier layers are alternatingly laminated. A p type $Al_xGa_{1-x}As$ (x=0.48) first upper cladding layer 5 having a thickness of 0.3 µm is disposed on the active layer 4. A p type $Al_xGa_{1-x}As$ (x=0.7) etch stopping layer 6 having a thickness of 0.02 µm is disposed on the first upper cladding layer 5. A p type $Al_xGa_{1-x}As$ (x=0.48) second upper cladding layer 7 having a thickness of 1.2 µm is disposed on a central portion of the etch stopping layer 6. A p type GaAs cap layer 8 having a thickness of 1 µm is disposed on the second upper cladding layer 7. The second upper cladding layer 7 and the cap layer 8 form a stripe-shaped ridge structure. N type GaAs current blocking layers 9 having a thickness of 1 µm are disposed on the etch stopping layer 6 at both sides of the ridge structure. P type GaAs layers 10 having a thickness of 1.2 µm are disposed on the current blocking layers 9. A p type GaAs contact layer 11 having a thickness of 2 µm is disposed on the cap layer 8 and on the p type GaAs layers 10. An n side electrode 20 comprising AuGe/Ni/Au is disposed on the rear surface of the substrate 1. A p side electrode 21 comprising Cr/Au is disposed on the contact layer 11.

FIGS. 8(a)–8(d) are cross-sectional views illustrating process steps in a method of fabricating the semiconductor laser device shown in FIG. 7. In the figures, reference numeral 18 designates an $SiO_2$ film.

Initially, there are successively grown on the n type GaAs substrate 1 by MOCVD (Metal Organic Chemical Vapor Deposition), the n type GaAs buffer layer 2, the n type AlGaAs lower cladding layer 3, the quantum well active layer 4, the p type AlGaAs first upper cladding layer 5, the p type AlGaAs etch stopping layer 6, the p type AlGaAs second upper cladding layer 7, and the p type GaAs cap layer 8 (FIG. 8(a)).

Thereafter, an $SiO_2$ film is deposited on the p type GaAs cap layer 8 by sputtering and patterned to form a mask 18. Using the mask 18, the p type GaAs cap layer 8 is etched with a mixture of $NH_4OH$ and $H_2O_2$ and, subsequently, the second upper cladding layer 7 is wet-etched, thereby producing a ridge structure comprising the cap layer 8 and the second upper cladding layer 7 (FIG. 8(b)). The wet-etching is stopped at the etch stopping layer 6.

Next, the n type GaAs current blocking layer 9 and the p type GaAs layer 10 are successively grown on the etch stopping layer 6 contacting the both sides of the ridge structure by MOCVD (FIG. 8(c)).

After removal of the $SiO_2$ mask 18 with HF, the p type GaAs contact layer 11 is grown on the p type GaAs cap layer 8 and on the p type GaAs layer 10 by MOCVD. To complete the laser structure, the n side electrode 20 is formed on the rear surface of the GaAs substrate 1 and the p side electrode 21 is formed on the contact layer 11 (FIG. 8(d)).

A description is given of the operation of the 0.78 µm band AlGaAs semiconductor laser device. When a forward bias voltage is applied across the p side electrode 21 and the n side electrode 20, holes are injected into the active layer 4 from the p side electrode 21 through the p type layers 11, 8, 7, 6, and 5, and electrons are injected into the active layer 4 from the n side electrode 20 through the n type layers 1, 2, and 3. The injected charge carriers, i.e., electrons and holes, are confined within the active layer 4 and recombine to produce laser light, and this laser light is also confined within the active layer 4. The confinement of the charge carriers and the laser light within the active layer 4 is attributed to the fact that the energy band gap of the active layer 4 is smaller than the energy band gaps of the lower cladding layer 3 and the upper cladding layers 5 and 7 and, therefore, the refractive index of the active layer 4 is larger than the refractive indices of those cladding layers 3, 5, and 7. When the current flowing between the electrodes 21 and 20 exceeds a threshold current level, the laser device oscillates and outputs laser light continuously. The wavelength of the generated laser light is proportional to the inverse of the energy band gap of the active layer 4. Therefore, in the prior art semiconductor laser device, the active layer 4 is made of AlGaAs having an energy band gap that can be changed by changing the Al composition, and the Al composition is selected so that the laser produces laser light having a wavelength of 0.78 µm. More specifically, the active layer 4 comprises alternating $Al_xGa_{1-x}As$ (x=0.1) well layers and $Al_xGa_{1-x}As$ (x=0.35) barrier layers.

The above-described prior art semiconductor laser device has the following drawbacks.

Since the lattice constant of the AlGaAs layers for the lower cladding layer 3 and the upper cladding layers 5 and 7 is larger than the lattice constant of the GaAs substrate 1 and the GaAs contact layer 11, the laser device has a stress within the crystalline structure. The amount of the stress depends on the compositions and the thicknesses of the cladding layers 3, 5, and 7. In the semiconductor laser device having an oscillation wavelength of 0.78 µm, in order to prevent overflow of charge carriers and improve the temperature characteristics of the laser, it is necessary to make the energy band gaps of the cladding layers 3, 5, and 7 larger than an energy band gap that is equivalent to 615 nm. When the cladding layers comprise AlGaAs, the Al composition must be larger than 0.47. In this case, the difference between the lattice constant of the AlGaAs cladding layers and the lattice constant of the GaAs substrate 1 and the GaAs contact layer 11 exceeds 0.06%.

Furthermore, the lower AlGaAs cladding layer 3 and the upper AlGaAs cladding layers 5 and 7 are sandwiched by the GaAs layers 1, 2, 8, and 11. In this case, if the thickness of the lower cladding layer 3 or the total thickness of the upper cladding layers 5 and 7 is thinner than 1.5 µm, laser light reaches the GaAs layers. Since the energy band gap of GaAs is smaller than the energy band gap that is equivalent to the oscillation wavelength of the laser, the laser light is absorbed in the GaAs layers, resulting in a high oscillation threshold current. Therefore, in the prior art semiconductor laser device, the thicknesses of the AlGaAs layers 3, 5, and 7 that have the lattice constant about 0.06% different from the lattice constant of the GaAs substrate 1 and the GaAs contact layer 11 must be 3 µm or more, in total, at the upper and lower sides of the active layer 4, whereby a considerable stress is applied to the active layer 4. This stress causes crystalline defects, i.e., dislocations, in the active layer 4, whereby the laser characteristics are significantly degraded. That is, the injected charge carriers recombine at the dislocations, and the recombination of charge carriers increases the operating current and breeds dislocations that cause a further increase in the operating current. As a result, the reliability of the semiconductor laser device is degraded.

Furthermore, the p type $Al_xGa_{1-x}As$ (x=0.7) etch stopping layer 6 is employed to improve the controllability of the wet etching when the ridge structure is produced, and actually the controllability is significantly improved by the etch stopping layer 6. However, since the etch stopping layer 6 has such a high Al composition, the surface of the etch stopping layer 6 is easily oxidized and an oxide film is formed at the surface. The oxide film adversely affects the subsequent crystal growth. Therefore, in the prior art semiconductor laser device, the current blocking layer 9, the GaAs layer 10, and the contact layer 11, which are grown on the etch stopping layer 6, have a density of crystalline defects, i.e., dislocations, as high as $1,000,000/cm^2$. In this case, laser light from the upper cladding layer 5 is absorbed in the dislocations and the density dislocations is increased, whereby the laser characteristics are degraded, resulting in a reduction in the reliability of the semiconductor laser device.

As described above, the stress in the crystalline structure of the laser is caused by the lattice constant of the AlGaAs cladding layers 3, 5 and 7 being larger than the lattice constant of the GaAs substrate 1 and the GaAs contact layer 11. So, as a countermeasure against this problem, InGaP or AlInGaP having a lattice constant equivalent to the lattice constant of GaAs for the cladding layers might be employed. However, InGaP and AlInGaP have the following drawbacks. That is, InGaP has an energy band gap equivalent to a wavelength of about 650 nm, and this is smaller than the energy band gap equivalent to a wavelength of 615 nm that is required for preventing the overflow of charge carriers. Therefore, if InGaP is employed for the cladding layers, overflow of charge carriers occurs, and the temperature characteristics of the laser are degraded. On the other hand, AlInGaP easily takes oxygen when it is grown and, therefore, it is difficult to grow high-quality AlInGaP. In addition, it is not possible to increase the p type carrier concentration.

Furthermore, the crystalline defects in the current blocking layer 9 are caused by the current blocking layer 9 being grown on the surface of the etch stopping layer 6 comprising a crystalline material that has a high Al composition and, therefore, is easily oxidized. As a countermeasure against the crystalline defects, a GaAs layer or an AlGaAs layer having a low Al composition is disposed under the etch stopping layer 6 having a high Al composition, and the etch stopping layer 6 is selectively removed with HCl. In this case, however, since the GaAs or AlGaAs layer under the etch stopping layer 6 has a small energy band gap and a large refractive index, this layer must be very thin to avoid degradation of laser characteristics due to absorption of generated laser light. For example, a GaAs layer thinner than 20 Å or an $Al_xGa_{1-x}As$ (x=0.2) layer thinner than 50 Å is employed. However, when the layer under the etch stopping layer 6 is as thin as described above, it is difficult to selectively remove the etch stopping layer 6.

SUMMARY OF THE INVENTION

It is an object of the present invention to provide a semiconductor laser device that prevents the degradation of laser characteristics and increases reliability by reducing the stress in crystalline structure of the laser and crystalline defects.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a semiconductor laser device comprises a first conductivity type GaAs substrate; a first conductivity type first lower cladding layer disposed on the GaAs substrate, lattice-matching with the GaAs substrate and having an energy band gap; a first conductivity type AlGaAs second lower cladding layer disposed on the first lower cladding layer and having an energy band gap larger than the energy band gap of the first lower cladding layer; an active layer disposed on the second lower cladding layer and having an energy band gap smaller than the energy band gap of the first lower cladding layer; a second conductivity type AlGaAs second upper cladding layer disposed on the active layer and having an energy band gap; a second conductivity type first upper cladding layer disposed on the second upper cladding layer, lattice-matching with the GaAs substrate, and having an energy band gap larger than the energy band gap of the active layer and smaller than the energy band gap of the second upper cladding layer; second conductivity type GaAs contact layer disposed on the first upper cladding layer; and first and second electrodes respectively disposed on the substrate and the contact layer. In this structure, unwanted overflow of charge carriers is prevented by the second lower cladding layer and the second upper cladding layer, and the thicknesses of these cladding layers for the prevention of the overflow of charge carriers can be reduced. Further, since the first lower cladding layer lattice-matches with the GaAs substrate and the second upper cladding layer lattice-matches with the GaAs substrate and the GaAs contact layer, a stress applied to the active layer is reduced, whereby degradation of laser characteristics is avoided.

According to a second aspect of the present invention, a semiconductor laser device comprises a first conductivity type semiconductor substrate; a first conductivity type lower cladding layer disposed on the semiconductor substrate and having an energy band gap; an active layer disposed on the lower cladding layer and having an energy band gap smaller than the energy band gap of the lower cladding layer; a second conductivity type first upper cladding layer disposed on the active layer and having an energy band gap larger than the energy band gap of the active layer; a second conductivity type InGaP first etch stopping layer disposed on the first upper cladding layer and having an energy band gap larger than the energy band gap of the active layer; a ridge structure comprising a second conductivity type second etch stopping layer disposed on a central portion of the first etch stopping layer and a second conductivity type second upper cladding layer disposed on the second etch stopping layer, the second etch stopping layer comprising a material having an energy band gap larger than the energy band gap of the active layer, the material being resistant to an etchant that etches the second upper cladding layer and being selectively etched by an etchant that does not etch the first etch stopping layer; first conductivity type current blocking layers disposed on the first etch stopping layer, contacting both sides of the ridge structure; and first and second electrodes respectively disposed on the substrate and the contact layer. In this structure, since the current blocking layer is produced on the InGaP etch stopping layer that is not easily oxidized, the crystalline defect density in the current blocking layer is significantly reduced. Further, since the energy band gap of the InGaP etch stopping layer is larger than the energy band gap of the active layer, the InGaP etch stopping layer does not absorb laser light, so that the laser characteristics are not degraded.

According to a third aspect of the present invention, a method of fabricating a semiconductor laser device comprises successively epitaxially growing on a first conductivity type GaAs substrate a first conductivity type InGaP first lower cladding layer having an energy band gap, a first conductivity type AlGaAs second lower cladding layer having an energy band gap larger than the energy band gap of the first lower cladding layer, an active layer having an energy band gap smaller than the energy band gap of the second lower cladding layer, a second conductivity type AlGaAs second upper cladding layer having an energy band gap larger than the energy band gap of the active layer, and a second conductivity type InGaP first upper cladding layer having an energy band gap smaller than the energy band gap of the second upper cladding layer; and epitaxially growing a GaAs contact layer on the first upper cladding layer. In a semiconductor laser device fabricated by this method, unwanted overflow of charge carriers is prevented by the AlGaAs second lower cladding layer and the AlGaAs second upper cladding layer, and the thicknesses of these cladding layers for the prevention of the overflow of charge carriers can be reduced. Further, since the InGaP first lower cladding layer lattice-matches with the GaAs substrate and the InGaP second upper cladding layer lattice-matches with the GaAs substrate and the GaAs contact layer, a stress applied to the active layer is reduced, whereby degradation of laser characteristics is avoided.

According to a fourth aspect of the present invention, a method of fabricating a semiconductor laser device comprises successively epitaxially growing on a semiconductor substrate a first conductivity type lower cladding layer, an active layer, a second conductivity type first upper cladding layer, a second conductivity type InGaP first etch stopping layer, a second etch stopping layer, and a second conductivity type second upper cladding layer; removing portions of the second upper cladding layer with a first etchant to form a ridge structure on a prescribed region of the second etch stopping layer; removing portions of the second etch stopping layer in regions other than the region where the ridge structure is present, with a second etchant, thereby exposing the first etch stopping layer; and epitaxially growing a first conductivity type current blocking layer on the first etch stopping layer that is exposed by the etching of the second etch stopping layer, contacting both sides of the second etch stopping layer and the ridge structure. In this method, since the current blocking layer is grown on the InGaP etch stopping layer that is not easily oxidized, the crystalline defect density in the current blocking layer is significantly reduced.

DETAILED DESCRIPTION OF THE PREFERRED EMBODIMENTS

[Embodiment 1]

Figure 1:
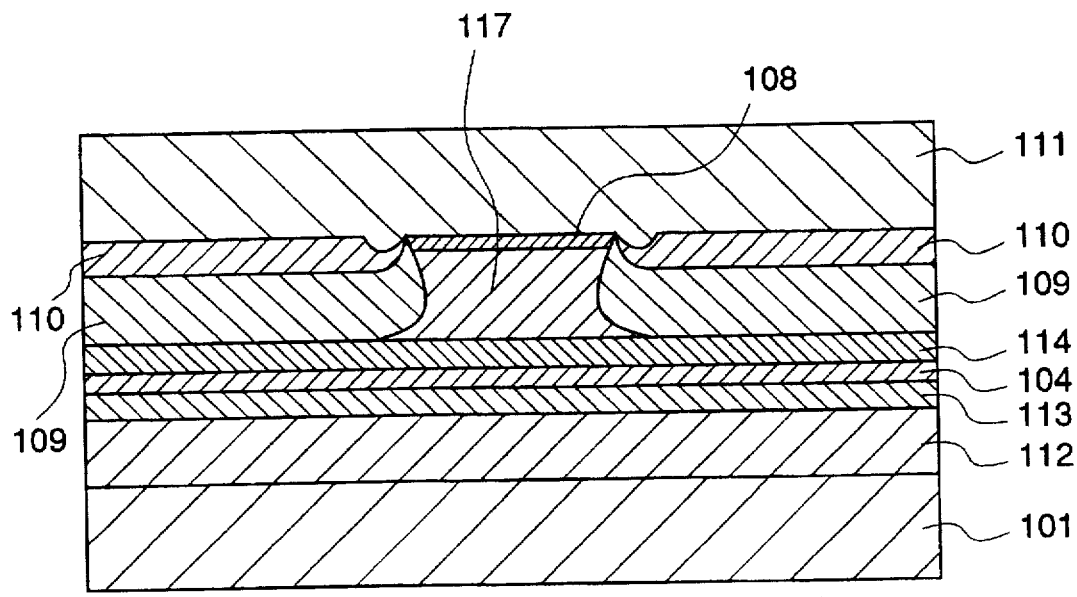
FIG. 1 is a cross-sectional view illustrating a semiconductor laser device in accordance with a first embodiment of the present invention.

FIG. 1 is a cross-sectional view illustrating a semiconductor laser device in accordance with a first embodiment of the present invention.

The semiconductor laser device shown in FIG. 1 includes a first conductivity type GaAs substrate 101 having opposed front and rear surfaces. A first conductivity type first lower cladding layer 112 having an energy band gap and lattice-matching with the GaAs substrate 101 is disposed on the front surface of the GaAs substrate 101. A first conductivity type AlGaAs second lower cladding layer 113 having an energy band gap larger than the energy band gap of the first lower cladding layer 112 is disposed on the first lower cladding layer 112. An active layer 104 having an energy band gap smaller than the energy band gap of the first lower cladding layer 112 is disposed on the second lower cladding layer 113. A second conductivity type AlGaAs second upper cladding layer 114 having an energy band gap is disposed on the active layer 104. A second conductivity type first upper cladding layer 117 having an energy band gap larger than the energy band gap of the active layer 104 and smaller than the energy band gap of the second upper cladding layer 114 and lattice-matching with the GaAs substrate 101 is disposed on a central portion of the second upper cladding layer 114. A second conductivity type cap layer 108 is disposed on the first upper cladding layer 117. The first upper cladding layer 117 and the cap layer 108 form a ridge structure. First conductivity type current blocking layers 109 are disposed on the second upper cladding layer 114 at both sides of the ridge structure. Second conductivity type GaAs layers 110 are disposed on the current blocking layers 109. A second conductivity type GaAs contact layer 111 is disposed on the cap layer 108 and on the GaAs layers 110.

In this semiconductor laser device, each of the upper cladding layer and the lower cladding layer has a double-layer structure. More specifically, the first lower cladding layer 112 that lattice-matches with the GaAs substrate 101 and has an energy band gap larger than the energy band gap of the active layer 104 is disposed on the GaAs substrate 101, and the first upper cladding layer 117 that lattice-matches with the GaAs substrate 101 and the GaAs contact layer 111 and has an energy band gap equivalent to the energy band gap of the first lower cladding layer 112 is disposed under the GaAs contact layer 111 with the cap layer 108 between them. Thereby, the stress within the crystalline structure of the laser is reduced. Furthermore, the AlGaAs second lower cladding layer 113 having an energy band gap larger than the energy band gap of the first lower cladding layer 112 is disposed on the first lower cladding layer 112, and the AlGaAs second upper cladding layer 114 having an energy band gap larger than the energy band gap of the first upper cladding layer 117 is disposed under the first upper cladding layer 117. Although a decrease the lattice constant is inconsistent with an increase in the energy band gap in AlGaAs, when the above-described double-layer cladding structure is employed, it is possible to give priority to the energy band gap over the lattice constant for the AlGaAs second lower cladding layer 113 and the AlGaAs second upper cladding layer 114. Therefore, unwanted overflow of charge carriers can be prevented by appropriately selecting, i.e., increasing, the energy band gaps of the second lower cladding layer 113 and the second upper cladding layer 114.

Although the double-layer cladding structure must have a sufficient thickness to prevent laser light generated in the active layer 104 from reaching the GaAs substrate 1, the cap layer 108, and the contact layer 111, the above-described overflow preventing effect is achieved even when the thicknesses of the second lower cladding layer 113 and the second upper cladding layer 114 are reduced. On the other hand, the amount of the stress produced in the crystalline structure of the laser due to the large lattice constants of the second lower cladding layer 113 and the second upper cladding layer 114 depends on the thicknesses of these cladding layers 113 and 114. So, when the thicknesses of the second lower cladding layer 113 and the second upper cladding layer 114 are as thin as possible and the thicknesses of the first lower cladding layer 112 and the first upper cladding layer 117 are increased, both the prevention of the overflow of charge carriers and the reduction in the stress in the crystalline structure are realized at the same time, which was difficult in the prior art laser device. Therefore, in the semiconductor laser device according to the first embodiment, the stress applied to the active layer 104 is reduced, so that no crystalline defects are produced during the high-power output operation of the laser. As a result, degradation of laser characteristics due to crystalline defects is avoided, whereby the reliability of the device is improved.

[Embodiment 2]

Figure 2:
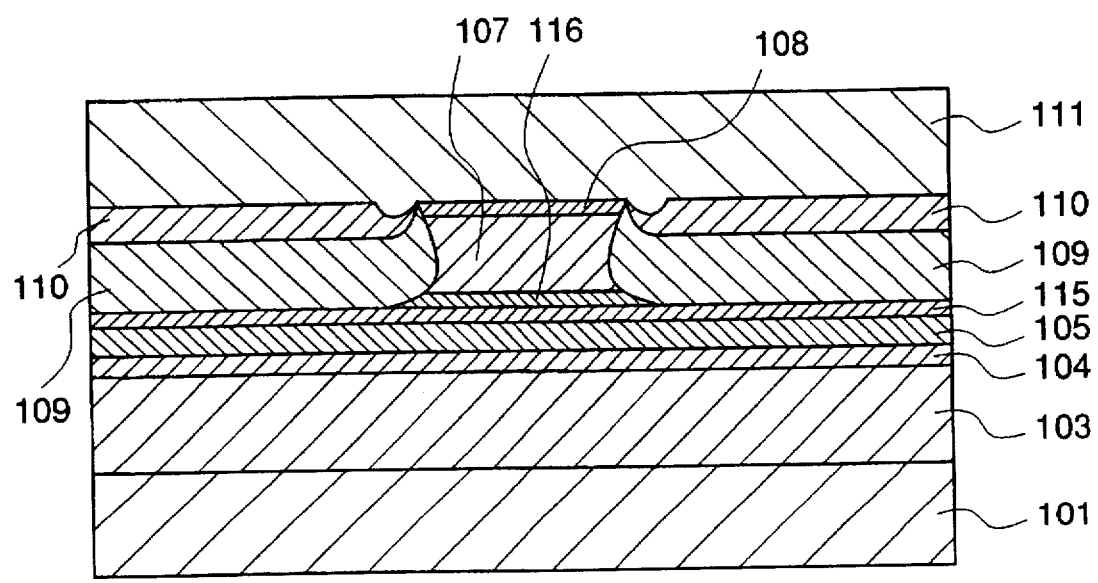
FIG. 2 is a cross-sectional view illustrating a semiconductor laser device in accordance with a second embodiment of the present invention.

FIG. 2 is a cross-sectional view illustrating a semiconductor laser device in accordance with a second embodiment of the present invention. In the figure, the same reference numerals as those in FIG. 1 designate the same or corresponding parts.

The semiconductor laser device shown in FIG. 2 includes a first conductivity type GaAs substrate 101 having opposed front and rear surfaces. A first conductivity type lower cladding layer 103 having an energy band gap is disposed on the front surface of the GaAs substrate 101. An active layer 104 having an energy band gap smaller than the energy band gap of the lower cladding layer 103 is disposed on the lower cladding layer 103. A second conductivity type first upper cladding layer 105 having an energy band gap larger than the energy band gap of the active layer 104 is disposed on the active layer 104. A second conductivity type InGaP first etch stopping layer 115 having an energy band gap larger than the energy band gap of the active layer 104 is disposed on the first upper cladding layer 105. A second conductivity type second etch stopping layer 116 is disposed on a portion of the first etch stopping layer 115. A second conductivity type second upper cladding layer 107 is disposed on the second etch stopping layer 116. A second conductivity type cap layer 108 is disposed on the second upper cladding layer 107. The second etch stopping layer 116, the second upper cladding layer 107, and the cap layer 108 form a ridge structure. First conductivity type current blocking layers 109 are disposed on the first etch stopping layer 115 at both sides of the ridge structure. Second conductivity type GaAs layers 110 are disposed on the current blocking layers 109. A second conductivity type GaAs contact layer 111 is disposed on the cap layer 108 and on the GaAs layers 110. In this structure, the second etch stopping layer 116 comprises a material having an energy band gap larger than the energy band gap of the active layer 104 and resistant to an etchant that etches the second upper cladding layer 107. Further, the material can be selectively etched with an etchant that does not etch the first etch stopping layer 115.

In the semiconductor laser device according to this second embodiment, the current blocking layer 109 is disposed on the first etch stopping layer 115 comprising InGaP. Therefore, when the current blocking layer 109 is grown by MOCVD, the surface of the substrate where this layer is grown is made of InGaP that is not easily oxidized, so that no surface oxidation occurs. Therefore, the crystal growth of the current blocking layer 109 is significantly facilitated, and the crystalline defect density in the current blocking layer 109 is significantly reduced. In addition, since the InGaP first etch stopping layer 115 has an energy band gap larger than the energy band gap equivalent to the wavelength of laser light produced in the active layer 104 and has a sufficiently small refractive index, it does not absorb the laser light to degrade the laser characteristics. As a result, the laser device according to the second embodiment of the invention avoids the problem of the prior art laser device, that is, degradation of laser characteristics due to absorption of laser light from the upper cladding layer at dislocations and an increase in the number in dislocations, resulting in an increase in reliability.

Furthermore, the second etch stopping layer 116 is disposed on the first etch stopping layer 115, and the second etch stopping layer 116 comprises a material which is not etched by an etchant that etches the second upper cladding layer 107 but is etched by an etchant that does not etch the first etch stopping layer 115. Therefore, when the ridge structure is formed, the second upper cladding layer 107 is etched selectively with respect to the second etch stopping layer 116, whereby the controllability of the ridge formation is improved. Thereafter, the second etch stopping layer 116 is etched selectively with respect to the InGaP first etch stopping layer 115 to expose the InGaP layer 115 at the surface of the substrate where the current blocking layer 9 is later grown. Therefore, the above-described effect of reducing the crystalline defect density in the current blocking layer 109 is achieved.

[Embodiment 3]

Figure 3:
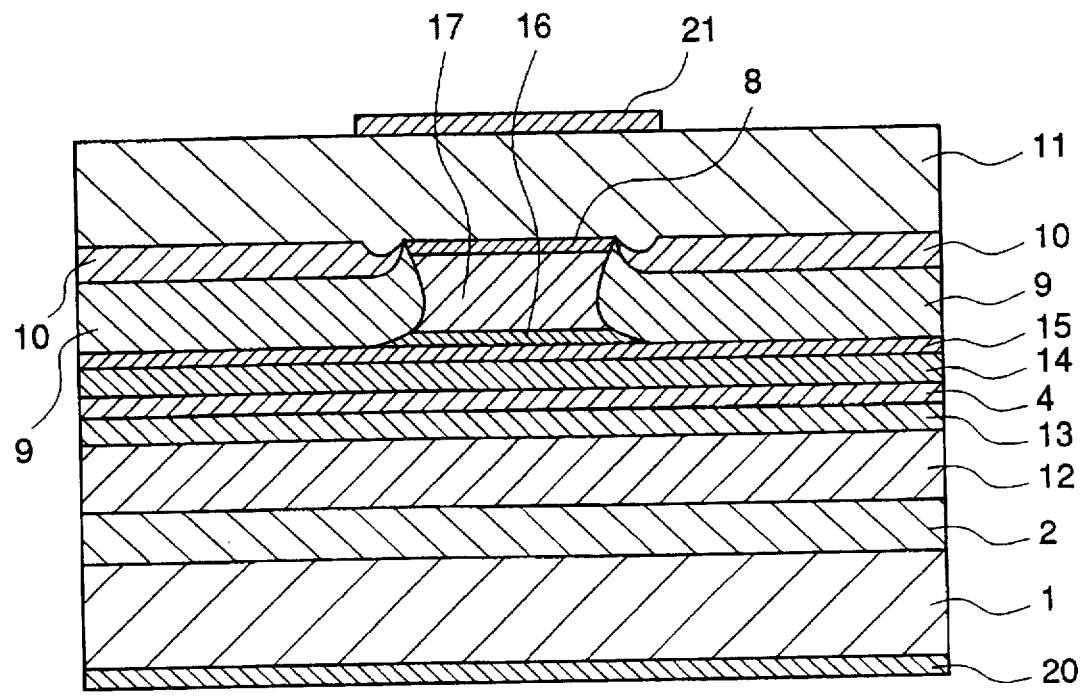
FIG. 3 is a cross-sectional view illustrating a semiconductor laser device in accordance with a third embodiment of the present invention.

FIG. 3 is a cross-sectional view illustrating a semiconductor laser device in accordance with a third embodiment of the present invention. In the figure, reference numeral 1 designates an n type GaAs substrate having opposed front and rear surfaces. An n type GaAs buffer layer 2 having a thickness of 1 μm is disposed on the front surface of the n type GaAs substrate 1. An n type InGaP first lower cladding layer 12 having a thickness of 1.5 μm is disposed on the buffer layer 2. An n type $Al_xGa_{1-x}As$ (Al composition x=0.48) second lower cladding layer 13 having a thickness of 0.3 μm is disposed on the first lower cladding layer 12. An active layer 4 is disposed on the second lower cladding layer 13. The active layer 4 has a quantum well structure in which $Al_xGa_{1-x}As$ (x=0.1) well layers and $Al_xGa_{1-x}As$ (x=0.35) barrier layers are alternatingly laminated. A p type $Al_xGa_{1-x}As$ (x=0.48) second upper cladding layer 14 having a thickness of 0.3 μm is disposed on the active layer 4. A p type InGaP first etch stopping layer 15 having a thickness of 0.02 μm is disposed on the second upper cladding layer 14.

A p type $Al_xGa_{1-x}As$ (x=0.48) second etch stopping layer 16 having a thickness of 0.02 μm is disposed on a portion of the first etch stopping layer 15. A p type InGaP first upper cladding layer 17 having a thickness of 1.5 μm is disposed on the second etch stopping layer 16. A p type having layer 8 having a thickness of 0.1 μm is disposed on the first upper cladding layer 17. The second etch stopping layer 16, the first upper cladding layer 17, and the cap layer 8 form a ridge structure. N type GaAs current blocking layers 9 having a thickness of 1 μm and p type GaAs layers 10 having a thickness of 0.6 μm are successively disposed on regions of the first etch stopping layer 15 where the ridge structure is absent, whereby the ridge structure is buried in these layers. A p type GaAs contact layer 11 having a thickness of 2 μm is disposed on the p type GaAs layers 10 and on the cap layer 8. A p side electrode 21 comprising Cr/Au is disposed on the contact layer 11. An n side electrode 20 comprising AuGe/Ni/Au is disposed on the rear surface of the substrate 1.

The composition of InGaP employed for the first lower cladding layer 12 and the first upper cladding layer 17 is desired to be $In_xGa_{1-x}P$ (x=0.499±0.0065). When the composition of InGaP is within this range, the lattice mismatching degree of InGaP to GaAs that is employed for the substrate 1 and the contact layer 11 is $$\Delta a/a_0 < 1 \times 10^{-3}|$$

where Δa is the difference in lattice constants between the substrate 1 (contact layer 11) and the first lower cladding layer 12 (first upper cladding layer 17) in the direction perpendicular to the surface of the substrate 1 (contact layer 11), and $a_0$ is the lattice constant of the substrate 1 (contact layer 11). Since this lattice mismatching degree is negligible, it can be said that the first lower cladding layer 12 (first upper cladding layer 17) substantially lattice-matches with the substrate 1 (contact layer 11).

In this third embodiment of the invention, the second upper cladding layer 14 and the second lower cladding layer 13, each comprising $Al_xGa_{1-x}As$ (x=0.48), having a thickness of 0.3 μm, and having an energy band gap that is larger than the energy band gap of the active layer 4 and sufficient to prevent overflow of injected charge carriers, are disposed on the upper and lower surfaces of the active layer 4, respectively. Further, the first upper cladding layer 17 and the first lower cladding layer 12 each comprising InGaP, having a thickness of 1.5 μm, and having a lattice constant matching with the lattice constant of the GaAs contact layer 11 and the GaAs substrate 1 are disposed sandwiching the second upper cladding layer 14 and the second lower cladding layer 13. In this structure, the first upper cladding layer 17 and the first lower cladding layer 12 lattice-match with the GaAs contact layer 11 and the GaAs substrate 1, respectively, and the second lower cladding layer 13 and the second upper cladding layer 14, each comprising AlGaAs having a large lattice constant, are thinner than the thickness (1.5 μm) of the AlGaAs cladding layer of the prior art device. Therefore, the stress in the crystalline structure of the laser is reduced.

On the other hand, although the energy band gaps of the InGaP first cladding layer 12 and the InGaP first upper cladding layer 17 are not sufficient to prevent the overflow of injected charge carriers, since the AlGaAs second lower cladding layer 13 and the AlGaAs second upper cladding layer 14 disposed on the both sides of the active layer 4 have large energy band gaps, the overflow of injected charge carriers is prevented. A thickness of 0.1 μm is enough for the AlGaAs second lower cladding layer 13 and the AlGaAs second upper cladding layer 14 to prevent the overflow of injected charge carriers. Therefore, it is desired that the thicknesses of the AlGaAs second lower cladding layer 13 and the AlGaAs second upper cladding layer 14 are within a range from 0.1 μm to 0.5 μm, considering the stress produced in the crystalline structure. As a result, this third embodiment of the invention solves the problems of the prior art laser device, that is, the stress in the crystalline structure of the laser due to the AlGaAs cladding layers 3 and 7 and the overflow of charge carriers due to the InGaP layer.

A description is now given of a process of fabricating the semiconductor laser device according to this third embodiment of the invention. FIGS. 4(a)–4(e) are cross-sectional views illustrating process steps in a method of fabricating the semiconductor laser device. In these figures, the same reference numerals as those in FIG. 3 designate the same or corresponding parts. Reference numeral 18 designates an $SiO_2$ film, and reference numeral 19 designates a resist film.

Figure 4:
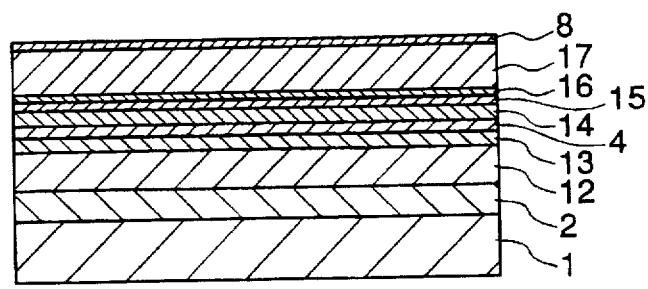
FIGS. 4(a)–4(e) are cross-sectional views illustrating process steps in a method of fabricating the semiconductor laser device shown in FIG. 3.
Figure 4:
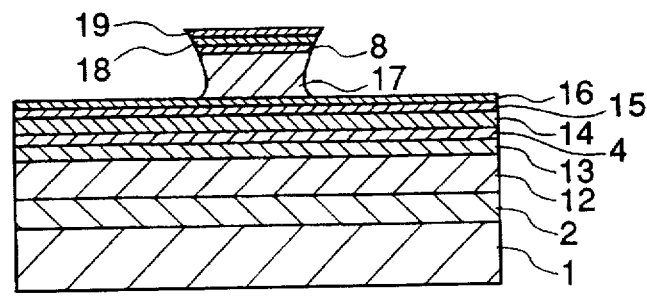
Figure 4:
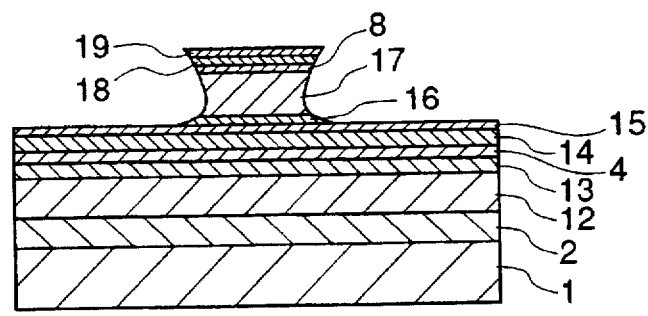
Figure 4:
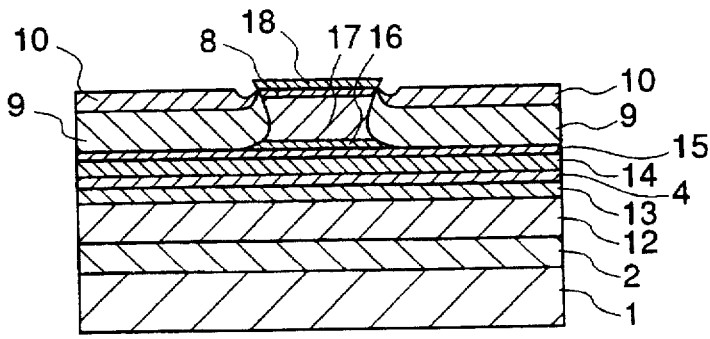
Figure 4:
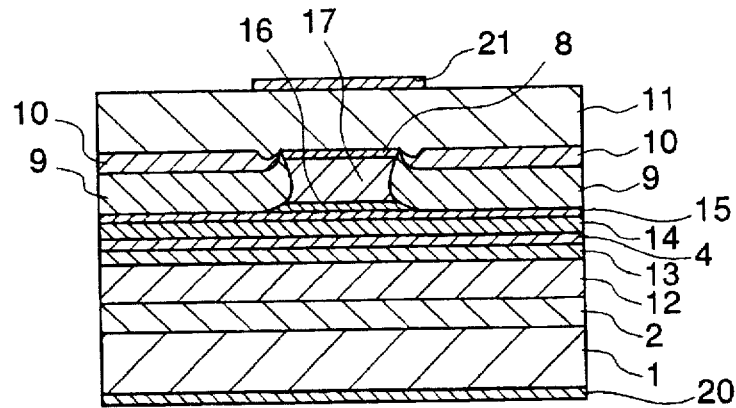

Initially, there are successively grown on the n type GaAs substrate 1 by MOCVD, the n type GaAs buffer layer 2, the n type InGaP first lower cladding layer 12, the n type AlGaAs second lower cladding layer 13, the quantum well active layer 4, the p type AlGaAs second upper cladding layer 14, the p type InGaP first etch stopping layer 15, the p type AlGaAs second etch stopping layer 16, the p type InGaP first upper cladding layer 17, and the p type GaAs cap layer 8 (FIG. 4(a)).

Thereafter, an $SiO_2$ film 18 is deposited over the p type GaAs cap layer 8 by sputtering, and a stripe-shaped resist film 19 is formed on the $SiO_2$ film 18. Using the resist film 19 as a mask, the $SiO_2$ film 18 is patterned. Thereafter, using the resist film 19 and the $SiO_2$ film 18 as masks, the p type GaAs cap layer 8 is etched with a mixture of $NH_4OH$ and $H_2O_2$ and, subsequently, the p type InGaP first upper cladding layer 17 is etched with a mixture of HCl and $H_2O$, thereby forming a ridge structure (FIG. 4(b)). Since the etching of the InGaP first upper cladding layer 17 with the mixture of HCl and $H_2O$ stops at the p type AlGaAs second etch stopping layer 16, very high reproducibility is obtained.

Next, using the resist film 19 and the $SiO_2$ film 18 as masks, portions of the p type AlGaAs second etch stopping layer 16 other than a portion where the ridge structure is present are selectively removed with HF to expose the first etch stopping layer 15 (FIG. 4(c)). After removal of the resist film 19, the n type GaAs current blocking layer 9 and the p type GaAs layer 10 are successively grown on the first etch stopping layer 15, contacting both sides of the ridge structure, by MOCVD (FIG. 4(d)). When the temperature is raised before the MOCVD growth, a $PH_3$ ambient is produced in the MOCVD apparatus. Since the first etch stopping layer 15 is exposed at the surface when the growth is carried out and this layer 15 does not comprise AlGaAs that is easily oxidized but comprises InGaP that does not contain Al, the surface of the first etch stopping layer 15 is not oxidized, so that a grown crystal with fewer crystalline defect is realized.

After removal of the $SiO_2$ mask 18 with HF, the p type GaAs contact layer 11 is grown on the p type GaAs cap layer 8 and on the p type GaAs layers 10 by MOCVD. Finally, the n side electrode 20 is produced on the rear surface of the GaAs substrate 1 and the p side electrode 21 is produced on the contact layer 11 to complete the semiconductor laser device (FIG. 4(e)).

In this third embodiment of the invention, as described above, the p type $Al_xGa_{1-x}As$ (x=0.48) second etch stopping layer 16 is present beneath the InGaP first upper cladding layer 17, and the p type InGaP first etch stopping layer 15 is present beneath the second etch stopping layer 16. Therefore, when a mixture of HCl and $H_2O_2$ is employed for the etching to produce the ridge structure, the etching stops at the AlGaAs second etch stopping layer 16 and only the InGaP first upper cladding layer 17 is selectively removed, whereby the ridge structure is produced with high controllability. After the formation of the ridge, the p type AlGaAs second etch stopping layer 16 is selectively etched with HF without etching the InGaP first upper cladding layer 17 at the side surfaces of the ridge, thereby exposing the p type InGaP first etch stopping layer 15. It is desired that the Al composition x of the p type $Al_xGa_{1-x}As$ second etch stopping layer 16 is within a range from 0.3 to 0.5 because the second etch stopping layer 16 is etched with HF when the Al composition x is smaller than 0.3 and with the mixture of HCl and $H_2O_2$ when the Al composition x is larger than 0.5.

Further, since the p type InGaP first etch stopping layer 15 and the p type AlGaAs second etch stopping layer 16 have energy band gaps larger than the energy band gap that is equivalent to the wavelength of laser light produced in the active layer 4, and sufficiently small refractive indices, it is not necessary to make these layers 15 and 16 very thin. Therefore, there is no difficultly in removing the upper etch stopping layer alone without removing the lower etch stopping layer.

Furthermore, when the n type GaAs current blocking layer 9 is grown, since the material exposed at the surface of the substrate for the growth is not AlGaAs that is easily oxidized but InGaP that is hardly oxidized, the crystal growth of the current blocking layer 9 is significantly facilitated, and the crystalline defect density, i.e., the dislocation density, in the current blocking layer 9 is reduced from $1,000,000/cm^2$ to $500/cm^2$.

In the structure before the crystal growth of the n type GaAs current blocking layer 9, InGaP is exposed at the surface of the substrate and the side surfaces of the ridge structure. Therefore, a $PH_3$ ambient is produced in the MOCVD apparatus in the temperature raising process before the crystal growth, thereby preventing escape of P atoms from the InGaP crystalline structure and formation of a degenerate layer at the growth interface.

A description is given of the operation of the semiconductor laser device according to the third embodiment of the invention.

When a voltage is applied across the n side electrode 20 and the p side electrode 21, electrons and holes are injected into the active layer 4 from the electrodes 20 and 21, respectively, and recombine to produce laser light. Since the stress in the crystalline structure of the semiconductor laser is reduced as compared to the prior art device, degradation in the laser characteristics due to dislocations in the crystalline structure is prevented even in the high-power output operation of the laser. In addition, since the crystalline defect density in the current blocking layer 9, the p type GaAs layer 10, and the contact layer 11 are significantly reduced as compared with the prior art laser device, degradation of the laser characteristics due to absorption of laser light exuded from the active layer 4 by the crystalline defects is prevented. As a result, a highly-reliable AlGaAs semiconductor laser device is realized.

[Embodiment 4]

Figure 5:
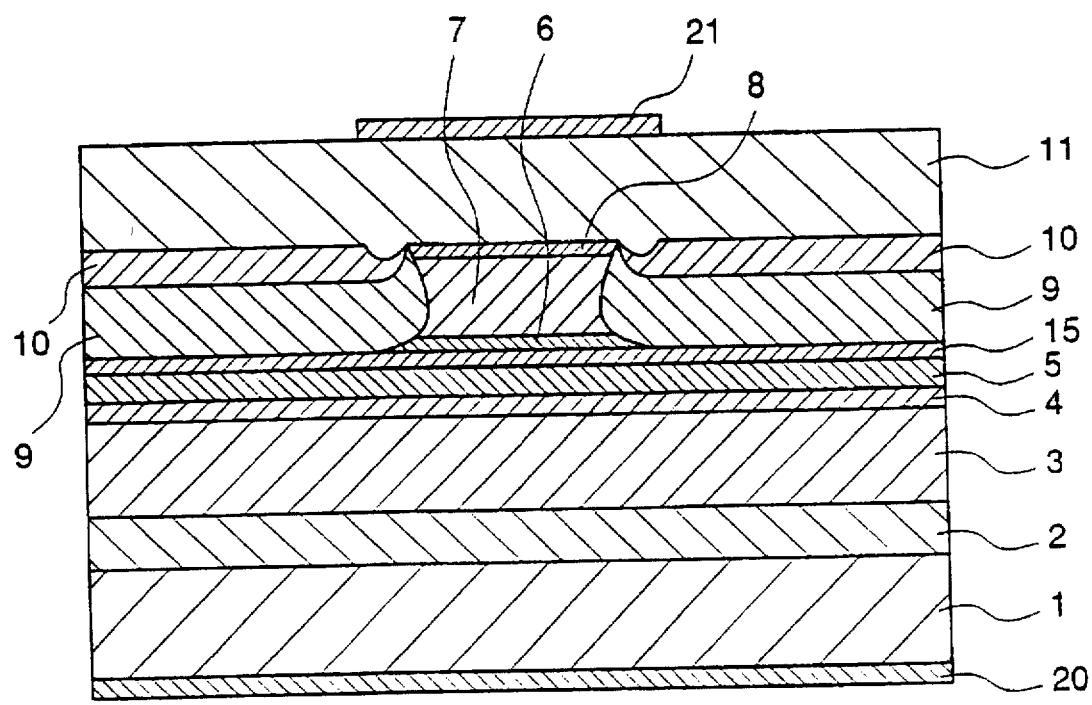
FIG. 5 is a cross-sectional view illustrating a semiconductor laser device in accordance with a fourth embodiment of the present invention.
Figure 6:
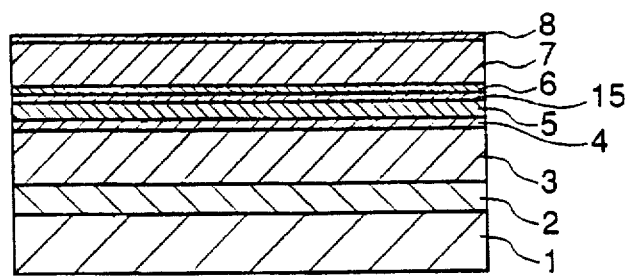
FIGS. 6(a)–6(e) are cross-sectional views illustrating process steps in a method of fabricating the semiconductor laser device shown in FIG. 5.
Figure 6:
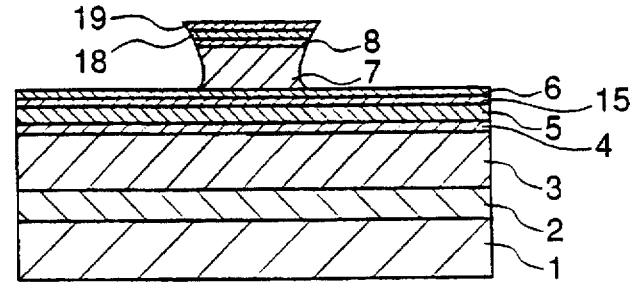
Figure 6:
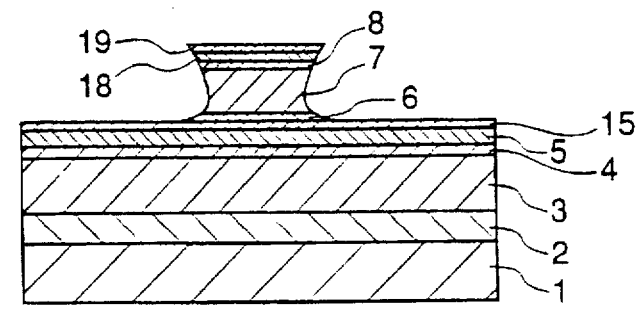
Figure 6:
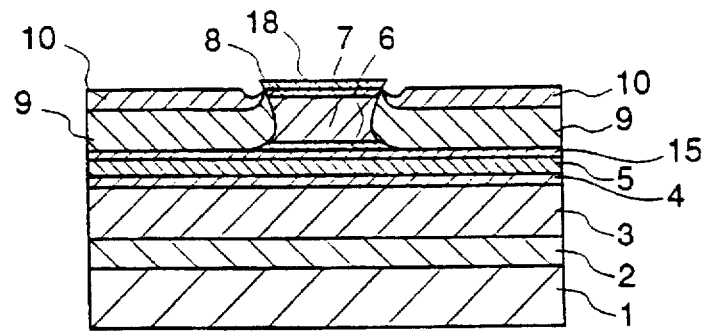
Figure 6:
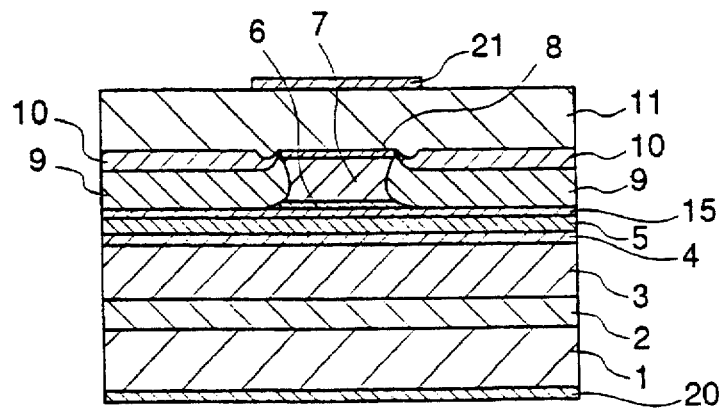
Figure 7:
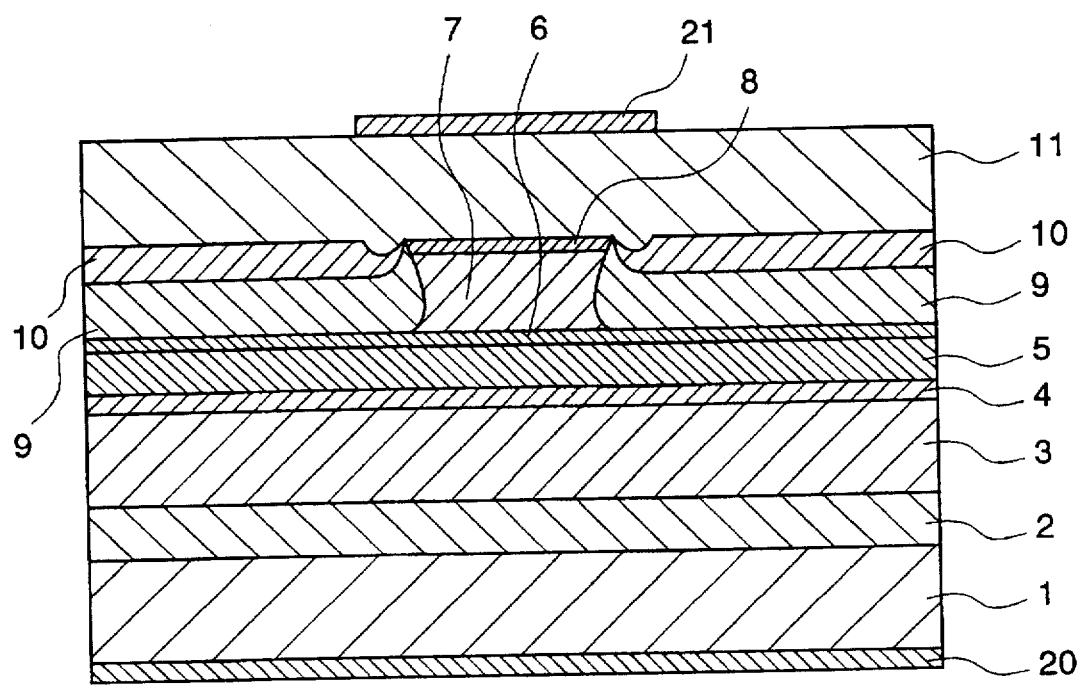
FIG. 7 is a cross-sectional view illustrating a semiconductor laser device according to the prior art.
Figure 8:
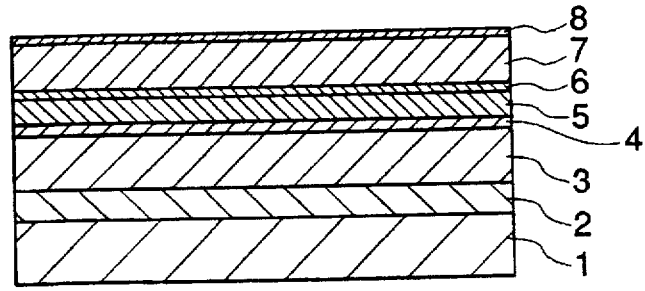
FIGS. 8(a)–8(d) are cross-sectional views illustrating process steps in a method of fabricating the semiconductor laser device shown in FIG. 7.
Figure 8:
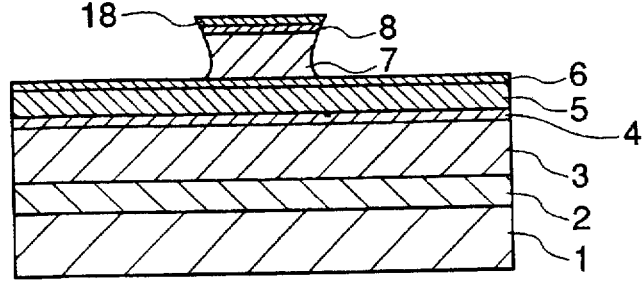
Figure 8:
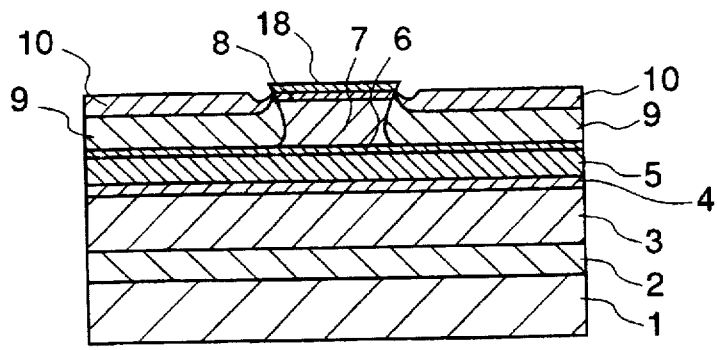
Figure 8:
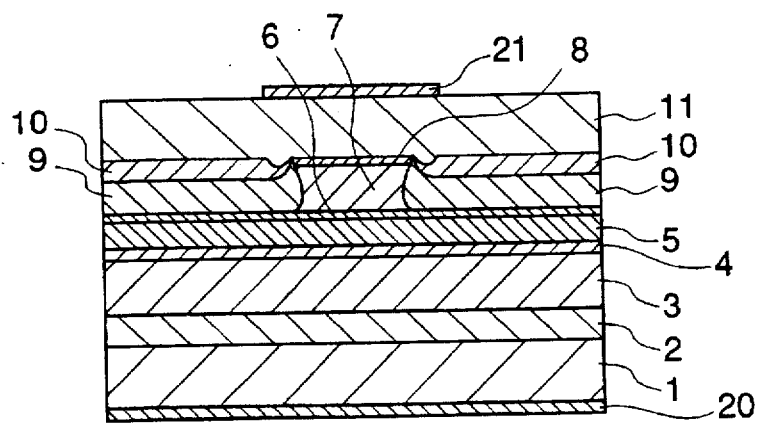

FIG. 5 is a cross-sectional view illustrating a semiconductor laser device in accordance with a fourth embodiment of the present invention. In the figure, the same reference numerals as those shown in FIG. 3 designate the same or corresponding parts. Reference numeral 3 designates an n type $Al_xGa_{1-x}As$ (x=0.48) lower cladding layer having a thickness of 1.5, reference numeral 5 designates a p type $Al_xGa_{1-x}As$ (x=0.48) first upper cladding layer 5 having a thickness of 0.3 μm, reference numeral 6 designates a p type $Al_xGa_{1-x}As$ (x=0.7) second etch stopping layer having a thickness of 0.02 μm, and numeral 7 designates a p type $Al_xGa_{1-x}As$ (x=0.48) second upper cladding layer having a thickness of 1.2 μm.

FIGS. 6(a)-6(e) are cross-sectional views illustrating process steps in a method of fabricating the semiconductor laser shown in FIG. 5.

A description is given of the fabricating process. Initially, there are successively grown on the n type GaAs substrate 1 the buffer layer 2, the lower cladding layer 3, the active layer 4, the first upper cladding layer 5, the first etch stopping layer 15, the second etch stopping layer 6, the second upper cladding layer 7, and the cap layer 8 (FIG. 6(a)). These layers are grown by crystal growth using MOCVD. Thereafter, an $SiO_2$ film 18 is deposited over the p type GaAs cap layer 8 by sputtering, and a stripe-shaped resist film 19 is formed on the $SiO_2$ film 18. Using the resist film 19 as a mask, the $SiO_2$ film 18 is patterned. Thereafter, using the resist film 19 and the $SiO_2$ film 18 as masks, the p type GaAs cap layer 8 is etched with a mixture of $NH_4OH$ and $H_2O_2$ and, subsequently, the second upper cladding layer 7 is etched with a mixture of tartaric acid and hydrogen peroxide, thereby producing a ridge structure (FIG. 6(b)). Since the etching of the second upper cladding layer 7 stops at the p type $Al_xGa_{1-x}As$ (x=0.7) second etching stopper layer 6, the ridge structure is produced with high reproducibility. Then, the p type AlGaAs second etch stopping layer 6 is selectively removed with a mixture of HF and $H_2O$ to expose the InGaP first etch stopping layer 15 at the surface of the substrate (FIG. 6(c)). After removal of the resist film 19, the n type GaAs current blocking layer 9 and the p type GaAs layer 10 are successively grown on the p type InGaP first etch stopping layer 15, contacting both sides of the ridge structure, using MOCVD (FIG. 6(d)). When the temperature is raised before the MOCVD growth, a $PH_3$ ambient is produced in the MOCVD apparatus.

After removal of the $SiO_2$ mask 18 with HF, the p type GaAs contact layer 11 is grown on the p type GaAs cap layer 8 and on the p type GaAs layer 10 by MOCVD. To complete the laser device, the n side electrode 20 is produced on the rear surface of the substrate 1 and the p side electrode 21 is produced on the contact layer 11 (FIG. 6(e)).

In this fourth embodiment of the invention, the p type InGaP first etch stopping layer is disposed beneath the p type $Al_xGa_{1-x}As$ (x=0.7) second etch stopping layer 6 that is easily oxidized and makes crystal growth thereon difficult. Therefore, when a mixture of tartaric acid and hydrogen peroxide is employed for the etching to produce the ridge structure, the etching stops at the p type AlGaAs second etch stopping layer 6 and only the AlGaAs second upper cladding layer 7 is selectively removed, whereby the ridge structure is produced with high controllability. After the formation of the ridge, the p type AlGaAs second etch stopping layer 6 is selectively etched with a mixture of HF and $H_2O$ without etching the $Al_xGa_{1-x}As$ (x=0.48) second upper cladding layer 7 at the side surfaces of the ridge, thereby exposing the p type InGaP first etch stopping layer 15. It is desired that the Al composition x of the p type $Al_xGa_{1-x}As$ second etch stopping layer 6 be higher than 0.6 because the AlGaAs second etch stopping layer 6 is easily etched with a mixture of tartaric acid and hydrogen peroxide when the Al composition x is smaller than 0.6.

In this fourth embodiment of the invention, since the InGaP first etch stopping layer 15 is employed, the crystalline defect density in the n type GaAs current blocking layer 9 is reduced as in the above-described third embodiment, whereby a highly reliable semiconductor laser device is realized.

In this fourth embodiment of the invention, however, in the structure before the growth of the n type GaAs current blocking layer 9, the p type InGaP first etch stopping layer 15 is exposed, and the p type AlGaAs upper cladding layer 7 and the p type GaAs cap layer 8 are exposed at the side surfaces of the ridge structure. That is, the surface of the structure comprises two kinds of Group V elements, i.e., P and As. In this case, it is difficult to prevent evaporation of the Group V elements during the growth temperature raising process. More specifically, when a PH$_3$ ambient is produced in the MOCVD apparatus in the temperature raising process to prevent loss of P atoms from the p type InGaP first etch stare unfavyer 15, As atoms are unfavorably lost from the p type AlGaAs upper cladding layer 7 and the p type GaAs cap layer 8. When an AsH$_3$ ambient is produced in the MOCVD apparatus, degenerate layers are formed at the surfaces of the p type AlGaAs upper cladding layer 7, the p type GaAs cap layer 8, and the p type InGaP first etch stopping layer 15.

However, the influence of the loss of As atoms from the upper cladding layer 7 and the cap layer 8 on the reliability of the laser device are negligible for the following reasons. That is, the n type GaAs current blocking layer 9 can be grown at a relatively low temperature, about 600° C., and As atoms in the p type AlGaAs upper cladding layer 7 having such high Al composition (0.48) are relatively stable and hardly evaporated at the low temperature. In addition, since the p type GaAs cap layer 8 is distant from the active layer 4, the evaporation of As atoms from the p type GaAs cap layer 8 does not adversely affect the laser characteristics. Therefore, in order to produce a high quality n type GaAs current blocking layer with reduced defect density that ensures a highly reliable semiconductor laser device, it is important to prevent the evaporation of P atoms from the p type InGaP first etch stopping layer 15 by producing a PH$_3$ ambient in the MOCVD apparatus in the temperature raising process before the growth of the current blocking layer.

What is claimed is:

1. A semiconductor laser device comprising:

a first conductivity type GaAs substrate;

a first conductivity type first lower cladding layer disposed on the GaAs substrate, lattice-matching with the GaAs substrate, and having an energy band gap;

a first conductivity type AlGaAs second lower cladding layer disposed on the first lower cladding layer and having an energy band gap larger than the energy band gap of the first lower cladding layer;

an active layer disposed on the second lower cladding layer and having an energy band gap smaller than the energy band gap of the first lower cladding layer;

a second conductivity type AlGaAs second upper cladding layer disposed on the active layer and having an energy band gap;

a second conductivity type first upper cladding layer disposed on the second upper cladding layer, lattice-matching with the GaAs substrate, and having an energy band gap larger than the energy band gap of the active layer and smaller than the energy band gap of the second upper cladding layer;

a second conductivity type GaAs contact layer disposed on the first upper cladding layer; and first and second electrodes respectively disposed on the substrate and the contact layer.

2. The semiconductor laser device of claim 1 wherein the first lower cladding layer comprises first conductivity type InGaP, and the first upper cladding layer comprises second conductivity type InGaP.

3. The semiconductor laser of claim 2 wherein the second upper cladding layer and the second lower cladding layer have thicknesses within a range from 0.1 μm to 0.5 μm.

4. A semiconductor laser device comprising:

a first conductivity type semiconductor substrate;

a first conductivity type lower cladding layer disposed on the semiconductor substrate and having an energy band gap;

an active layer disposed on the lower cladding layer and having an energy band gap smaller than the energy band gap of the lower cladding layer;

a second conductivity type first upper cladding layer disposed on the active layer and having an energy band gap larger than the energy band gap of the active layer;

a second conductivity type InGaP first etch stopping layer disposed on the first upper cladding layer and having an energy band gap larger than the energy band gap of the active layer;

a ridge structure comprising a second conductivity type second etch stopping layer disposed on a central portion of the first etch stopping layer and a second conductivity type second upper cladding layer disposed on the second etch stopping layer, the second etch stopping layer comprising a material having an energy band gap larger than the energy band gap of the active layer, resistant to an etchant that etches the second upper cladding layer, and selectively etched by an etchant that does not etch the first etch stopping layer;

first conductivity type current blocking layers disposed on the first etch stopping layer, contacting both sides of the ridge structure; and first and second electrodes respectively disposed on the substrate and the contact layer.

5. The semiconductor laser device of claim 4 wherein the second upper cladding layer comprises InGaP, and the second etch stopping layer comprises AlGaAs.

6. The semiconductor laser device of claim 5 wherein the second etch stopping layer comprises Al$_x$Ga$_{1-x}$As (x—0.3≦x≦0.5).

7. The semiconductor laser device of claim 4 wherein the second upper cladding layer comprises AlGaAs, and the second etch stopping layer comprises Al$_x$Ga$_{1-x}$(x≦0.6).

* * * * *